United States Patent [19]

Scammon, Jr. et al.

[11] 3,918,581

[45] Nov. 11, 1975

[54] SHIPPING PACKAGE FOR SEMICONDUCTOR CHIPS

[75] Inventors: Lawrence W. Scammon, Jr.; Leon E. Carlson, both of Concord, N.H.

[73] Assignee: Sprague Electric Company, North Adams, Mass.

[22] Filed: Aug. 2, 1974

[21] Appl. No.: 494,143

[52] U.S. Cl. ................. 206/334; 206/454; 206/523

[51] Int. Cl.[2] ................ B65D 73/02; B65D 81/04; B65D 85/30

[58] Field of Search ........ 206/328, 334, 454, 45.33, 206/523, 521

[56] References Cited

UNITED STATES PATENTS

| | | | |
|---|---|---|---|
| 2,681,142 | 6/1954 | Cohen | 206/521 |
| 3,256,975 | 6/1966 | Puente | 206/328 |
| 3,461,537 | 8/1969 | Lotz | 206/328 |
| 3,523,863 | 8/1970 | Juhos | 206/45.33 |
| 3,562,057 | 2/1971 | McAlister et al. | 206/328 |
| 3,562,058 | 2/1971 | Boyd | 206/328 |
| 3,615,006 | 10/1971 | Freed | 206/454 |
| 3,719,273 | 3/1973 | Abe | 206/328 |
| 3,777,882 | 12/1973 | McIntyre | 206/523 |

*Primary Examiner*—William T. Dixson, Jr.
*Attorney, Agent, or Firm*—Connolly and Hutz

[57] ABSTRACT

An array of transistors is formed in a monocrystalline semiconductor wafer. The wafer is hot press bonded to a thermoplastic sheet. The wafer is scribed and broken to separate the individual transistors. The sheet is stretched over a frame to space the transistor chips from each other. A piece of metallized film is placed metal-side-down over the matrix of chips. This assembly is placed within a resilient cushion and enclosed within a shipping box that inter alia compresses the cushion so as to make a pressure contact between each chip and the metallized film. The metallized film to chip bond affords a high shear strength, provides an added means for locking the chips in their matrix pattern, and prevents the dislodging of chips from the plastic sheet when the package is subjected to mechanical shock or vibration that may occur in handling or in transit.

6 Claims, 4 Drawing Figures

SHIPPING PACKAGE FOR SEMICONDUCTOR CHIPS

BACKGROUND OF THE INVENTION

This invention relates to shipping packages for semiconductor chips, and more particularly to the orderly packaging of all the chips having been made from one large semiconductor wafer. It is common practice to form a large number of transistors or other semiconductor components in a single semiconductor wafer, by standard steps including photolithographic masking and doping with various impurities. An array or a matrix of essentially identical transistors, diodes, integrated circuits, or other components are thus formed in one wafer and are subsequently separated by cutting or scribing and breaking along lines between the components.

One method of separating the individual component chips involves ironing the wafer onto a thermoplastic sheet, scribing the wafer, flexing the wafer to break it along scribe lines and stretching the sheet over a frame. The individual chips remain bonded to the plastic sheet in an orderly matrix but are each slightly spaced from each other and may be easily removed one by one.

It is often necessary or desirable to perform the subsequent chip or die bonding, lead attachment, and housing steps at a remote plant location. For example, the manufacturers of hybrid integrated circuits often purchase chip semiconductors from others. In this and in other situations it is important that the chips be packaged for shipment in such a way that they are not damaged and that they remain in an orderly predetermined pattern for easy removal. The above mentioned stretched plastic sheet carrier represents an excellent means for achieving the desired chip organization and accessibility.

Unfortunately, the stretching results in a degrading of the adherence of the chips to the plastic sheet. When such a chip-loaded stretched sheet is shipped in a cushioned packing box, the normal shocks received in handling and transit cause at least some chips to shake loose with consequent disorder, mechanical scratching and contamination of the chips.

It is therefore an object of this invention to provide a shipping package for semiconductor chips wherein the chips retain their order and are presented to the receiver in a predetermined pattern permitting efficient removal.

It is a further object of this invention to provide a shipping package for semiconductor chips wherein the chips are held securely during shipment and handling to avoid damage and contamination.

SUMMARY OF THE INVENTION

A shipping package for semiconductor chips comprises a frame over which a plastic sheet is stretched and fastened. A matrix of spaced semiconductor chips adheres to a surface of the plastic sheet. A metallized plastic film overlies the matrix of chips with a metallized face in contact with the chips. This assembly is encompassed by a resilient cushion that is held in compression by a housing that in turn contains the assembly and the encompassing cushion. The cushion may be a polyurethane foam material. The metallized film is held in pressurized contact with the chips by means of the compressed cushion, providing a greatly improved assurance that chips will not move from their matrix positions when the package is roughly handled as in shipping.

DESCRIPTION OF THE PREFERRED EMBODIMENT

Figure 1:
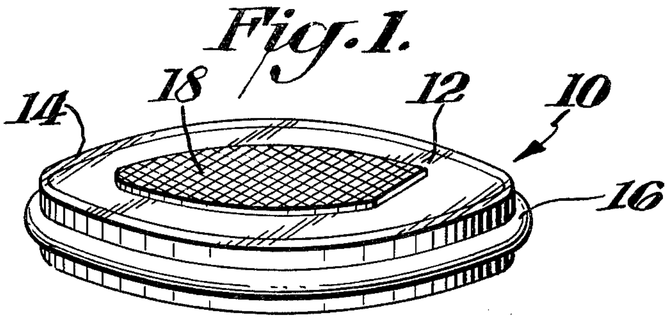
In FIG. 1 is shown in isometric view, and in FIG. 2 is shown a top view, of an assembly including a matrix of semiconductor chips mounted on a taut plastic sheet.
Figure 2:
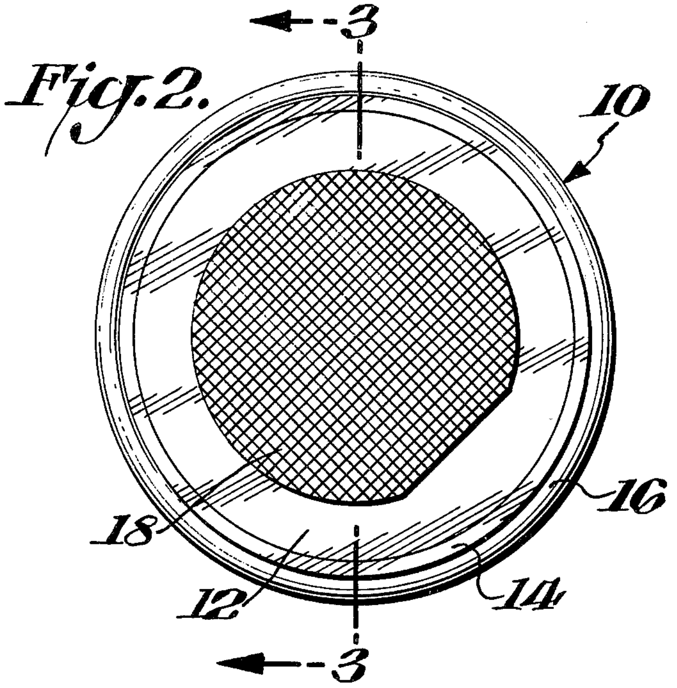
Figure 4:
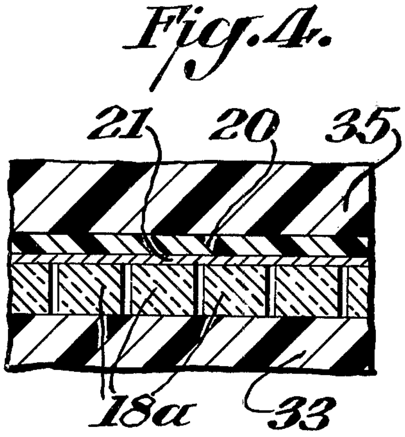
In FIG. 4 is shown a detail in magnified scale of some of the packaged chips in FIG. 3.

In FIGS. 1 and 2 a plastic sheet 12 is stretched taut over a metal frame or band 14. The sheet 12 is fastened to the band 14 by a rubber ring 16 being stretched over the sheet at the outer periphery of the band. On the top surface of the sheet 12 is a matrix of semiconductor chips 18 which chips are bonded to the underlying plastic sheet.

The assembly as shown in FIGS. 1 and 2 is formed by placing a semiconductor wafer, typically 2½ inches in diameter, over a thermoplastic (e.g., polyethylene) sheet, and hot ironing and thus bonding the wafer to the sheet. The temperature of the iron is typically only slightly greater than the melting temperature of the thermoplastic, and the heat and pressure at ironing causes the underlying plastic to flow and subsequently solidify in bonded contact with the thermoplastic sheet.

The semiconductor wafer contains a checkerboard pattern of semiconductor components, such as diodes, transistors or integrated circuits. The component in each square of the checkerboard pattern is separate from but essentially identical to the component in the other squares.

After the wafer is bonded to the thermoplastic sheet, the wafer is scribed so as to scratch a fine channel between squares. The wafer is then subjected to a bending force so as to break the wafer along lines defined by the scribed channels. The plastic sheet to which the scribed and broken wafer still adheres is stretched over the frame 14 so as to physically separate the semiconductor components in an orderly matrix of spaced semiconductor component chips.

A rubber O-ring 16 is expanded and fitted over the portion of the sheet 12 that extends over the frame 14 holding the sheet taut in the frame.

The above described assembly provides a convenient carrier for the separated chips, for transporting the chips to a production station where the chips are presented in a systematic array, for picking up one at a time and die bonding to a metal lead frame for example. The removal of each chip from the plastic is easily accomplished by pressing the underneath face of the plastic sheet by a small pick or even the point of a pencil, so as to raise the wanted chip and make it prominent and easily selected for removal by a small suction tube.

Figure 3:
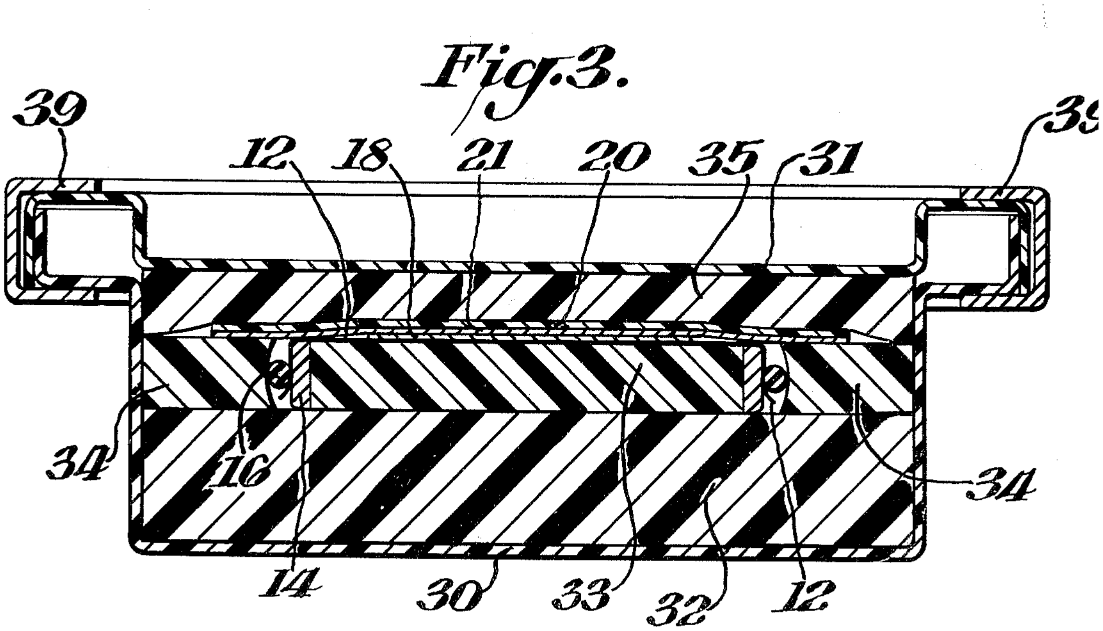
In FIG. 3 is a package of this invention shown in cross section including the assembly of FIGS. 1 and 2.

In FIG. 3 the assembly of FIGS. 1 and 2 is shown in section taken in plane 3—3. A polyethyleneterephthalate film 20 has a coating 21 of metal having been deposited on the bottom face. The metal coating 21 lies in contact with the matrix of spaced semiconductor chips 18. It is preferred to provide the metal coating 21 by the evaporation of aluminum on the film 20, but other coating metals such as gold, silver, and nickel are believed equally effective. This assembly 10 and the metallized film 20 are contained in a plastic housing being comprised of a tub 30 and a cover 31. The housing is generally of a cylindrical shape and lying in the cylindrical tub 30 is a disc shaped resilient disc 32 having a normal diameter slightly larger than the interior diameter of the tub 30, and thus being compressed therein. The above described assembly 10 is centrally positioned over the resilient disc 32. A second disc 33 of resilient material, having a thickness slightly larger than the width of the band 14 and having a diameter slightly larger than the inside diameter of the band 14 is fitted by compression within the cavity formed by the band and the plastic sheet 12. An annular piece 34 of resilient material is fitted around the periphery of the assembly 10 so as to be compressed between the walls of the tub 30 and the assembly 10. Likewise, a third disc of resilient material 35 is laid over the assembly 10 and the housing cover fitted over the tub opening, so as to compress disc 35. In general it is necessary to use at least two resilient pieces that together conformally encompass the assembly 10 and snugly fits within the housing (30 and 31). A foamed polyurethane is preferred for use as the resilient packing material. Metal clips 30 are snapped over mating flanges of the cover 31 and tub 30 to firmly hold the two housing pieces closed. The housing tub 30 and cover 31 are conveniently made of a thermoplastic resin such as polyethylene or polypropylene. However, any relatively rigid material is suitable, such as a metal or a thermosetting resin material.

As essential feature of the package is the pressure contact between the metallized face 21 and the matrix of chips 18, which pressure is achieved in this embodiment by the encompassing resilient pieces, especially pieces 32, 33 and 35, being compressed within the housing tub 30 and housing cover 31. It has been found through experimentation that when the metallization 21 is omitted from the plastic film or when the plastic film is omitted altogether, that the chips will not cling reliably to the plastic sheet and in fact many chips are shaken loose when the package is dropped or otherwise shocked as may occur in a normal shipment of such packages from one location to another through the mails or otherwise. However, quite surprisingly and for reasons not yet completely understood, the inclusion of a metallized film with the metallized face pressed against the matrix of chips provides in fact a reliable shockproof shipping package that provides protection against de-bonding and disordering of the chips in transit. Shock forces in a radial direction, with reference to the cylinder like package of FIG. 3, are the most likely to cause the dislodging of chips from the plastic sheet. It is theorized that the metallized film pressure contact between the metal and the chips provides a particularly strong bond in shear, and thus reinforces the spaced chips. On the other hand, when the package is opened and the film is lifted away from the matrix of spaced chips, there is little sticking and the chips advantageously remain adhered to the underlying plastic sheet. If the plastic film is not metallized, its tendency to stick is much greater and the danger of inadvertantly removing some of the chips from the matrix is accordingly greater.

Also, when the top surfaces of the chips includes metallized contact pads or interconnecting runs, the overlying metallized film provides a metal to metal pressure contact therewith. Thus no organic contaminants, for example plasticizers, are permitted to contact the chip contact pads. For this purpose a metal foil may be substituted for the metallized film (e.g., 20) but metallized plastic film is preferred since it is found to provide a more reliable mechanical support for the chips in the package of this invention.

What is claimed is:

1. A shipping package for semiconductor chips comprising:

a. a frame;

b. a plastic sheet drawn tightly over said frame and fastened thereto;

c. a matrix of spaced semiconductor chips adhering to a surface of said sheet;

d. a film having a metal face lying in contact with a surface of said chips;

e. a compressed resilient cushioning means encompassing the assembly of said frame, said sheet, said matrix and said film for the purpose of holding said film in compressed contact with said chips and for providing a protective cushion for said assembly; and f. a housing containing said assembly and said compressed resilient means.

2. The package of claim 1 wherein said frame is a circular band and wherein said fastening of said plastic sheet thereto is accomplished by a rubber ring being stretched over said sheet at the outer periphery of said metal band.

3. The package of claim 1 wherein said film is polyethyleneterephthalate being metallized on at least one surface.

4. The package of claim 1 wherein said metal face is aluminum having been vacuum deposited on said film.

5. The package of claim 1 wherein said cushioning means is composed of at least two polyurethane foam pieces having a generally conformal shape with respect to said encompassed assembly.

6. The package of claim 1 wherein said housing is a thermoplastic box with a cover.

* * * * *